United States Patent
M'Jahed et al.

(10) Patent No.: US 9,784,775 B2
(45) Date of Patent: Oct. 10, 2017

(54) METHOD FOR THE RAPID INTERROGATION OF A PASSIVE SENSOR, IN PARTICULAR OF THE SURFACE ACOUSTIC WAVES TYPE, AND SYSTEM FOR MEASURING THE UNIQUE FREQUENCY OF SUCH A SENSOR

(71) Applicants: UNIVERSITE DE LORRAINE, Nancy (FR); CENTRE NATIONAL DE LA RECHERCHE SCIENTIFIQUE, Paris (FR)

(72) Inventors: Mohamed M'Jahed, Les Nancy (FR); Gerard Prieur, Heillecourt (FR); Omar El Mazria, Seichamps (FR)

(73) Assignees: Universite de Lorraine, Nancy (FR); Centre National de la Recherche Scientifique, Paris (FR)

( * ) Notice: Subject to any disclaimer, the term of this patent is extended or adjusted under 35 U.S.C. 154(b) by 631 days.

(21) Appl. No.: 14/353,275

(22) PCT Filed: Oct. 19, 2012

(86) PCT No.: PCT/EP2012/070827
§ 371 (c)(1),
(2) Date: Apr. 21, 2014

(87) PCT Pub. No.: WO2013/057298
PCT Pub. Date: Apr. 25, 2013

(65) Prior Publication Data
US 2014/0253094 A1 Sep. 11, 2014

(30) Foreign Application Priority Data

Oct. 21, 2011 (FR) ...................... 11 59593

(51) Int. Cl.
*G01R 23/02* (2006.01)
*G01S 13/75* (2006.01)

(52) U.S. Cl.
CPC ............ *G01R 23/02* (2013.01); *G01S 13/753* (2013.01)

(58) Field of Classification Search
CPC .......... G01R 23/02; G01S 13/753; G01S 5/02
(Continued)

(56) References Cited

U.S. PATENT DOCUMENTS

| 6,362,737 B1 | 3/2002 | Rodgers et al. | |
| 2004/0239504 A1* | 12/2004 | Kalinin | B60C 23/0433 340/572.5 |
| 2010/0332157 A1* | 12/2010 | Friedt | B60C 23/0449 702/54 |

FOREIGN PATENT DOCUMENTS

| GB | 2411239 A | 8/2005 |
| WO | 2007005020 A1 | 1/2007 |

OTHER PUBLICATIONS

Zhi-Qi, A super-high resolution frequency standard measuring approach based on phase coincidence characteristics between signals, 2010, Chin. Phys. B, vol. 19, No. 9, pp. 090601-1-4.*

(Continued)

*Primary Examiner* — Melissa Koval
*Assistant Examiner* — Courtney McDonnough
(74) *Attorney, Agent, or Firm* — Baker Hostetler LLP (57) ABSTRACT

For passive sensor with resonator having a natural frequency, a method comprises: a first phase emission of an electromagnetic signal toward the passive sensor at an emission frequency, the resonator oscillating in a forced regime at the emission frequency and then oscillating at its natural frequency when the emission is cut off; a first phase reception of the damped signal oscillating at natural frequency emitted by passive sensor, a measurement of the (Continued)

frequency being performed; a second phase emission of an electromagnetic signal at the measured frequency toward the passive sensor, the resonator oscillating in a forced regime at the measured frequency and then oscillating at its natural frequency when the emission is cut off; a second phase reception of the damped signal oscillating at natural frequency, a measurement of the frequency being performed, determination of the natural frequency being stopped due to measurement performed in this second reception phase.

16 Claims, 5 Drawing Sheets

(58) Field of Classification Search
USPC .................................................. 324/76.39
See application file for complete search history.

(56) References Cited

OTHER PUBLICATIONS

Matthias Hamsch et al., "An Interrogation Unit for Passive Wireless SAW Sensors Based on Fourier Transform," IEEE Transaction on Ultrasonics, Ferroelectrics, and Frequenct Control, vol. 51, No. 11, Nov. 2004, pp. 1449-1456.
Ivan D. Avramov et al., "The RF-Powered Surface Wave Sensor Oscillator—A Successful Alternative to Passive Wireless Sensing," 2003 IEEE International Frequency Control Symposium and PDA Exhibition Jointly with the 17th European Frequency and Time Forum, pp. 911-917.

* cited by examiner

FIG.6

METHOD FOR THE RAPID INTERROGATION OF A PASSIVE SENSOR, IN PARTICULAR OF THE SURFACE ACOUSTIC WAVES TYPE, AND SYSTEM FOR MEASURING THE UNIQUE FREQUENCY OF SUCH A SENSOR

CROSS-REFERENCE TO RELATED APPLICATIONS

This application is a National Stage of International patent application PCT/EP2012/070827, filed on Oct. 19, 2012, which claims priority to foreign French patent application No. FR 1159593, filed on Oct. 21, 2011, the disclosures of which are incorporated by reference in their entirety.

FIELD OF THE INVENTION

The present invention relates to a method of fast interrogation of a passive sensor, notably a surface acoustic wave sensor. It also relates to a system for measuring the natural frequency of such a sensor.

It applies in particular in respect of the remote measurement of physical quantities such as temperature or pressure for example.

BACKGROUND

Passive sensors of the surface acoustic wave (SAW) type can be interrogated remotely. In practice, at least one sensor is embedded onboard a support disposed in the environment of the measurement to be performed. A remotely placed emission and reception system dispatches an electromagnetic wave toward the sensor coupled to a reception antenna. The emitted wave is picked up by this antenna and the sensor enters a forced regime. When this wave is cut off, the sensor continues to oscillate with its natural frequency and emits, via its antenna, a damped sinusoidal signal of very low power, which is thereafter detected by the emission reception system. The natural frequency, or resonant frequency, of the sensor being dependent on the physical quantity to be measured, the determination of this frequency makes it possible to perform this measurement.

Currently used procedures are based on an emission system employing a wave train, either fixed frequency, or broad spectrum. The weak signal originating from the sensor and received by the system reception and processing unit is transformed by frequency mixing often by two oscillators in quadrature into very low or zero intermediate frequencies and a demodulation notably of "I & Q" type, usually entirely digital, enables the resonant frequency Fo of the SAW sensor, and therefore the value sought, to be obtained approximately. In the current state of the art, to have sufficient accuracy in the determination of Fo demands numerous successive measurements and their processing generally requires several tens of milliseconds.

Moreover, this type of processing, generally based on a statistical study of the results of supposedly identical successive measurements, makes it imperative not to have large variations in the measurement conditions during the tens of milliseconds required for the measurement. These variations may notably be due to the evolution of the position or the speed of the sensors, the fast evolution of the conditions of propagation of the emitted and re-emitted waves or else the fast evolution of the quantity to be measured, these evolutions being significant when the duration of the measurements exceeds a millisecond.

It follows that these measurement systems do not make it possible, in the customary measuring conditions, to carry out a reliable and/or accurate measurement.

SUMMARY OF THE INVENTION

One of the aims of the invention is notably to allow measurements that are simultaneously fast, reliable and of high sensitivity. For this purpose, the subject of the invention is a method for remotely interrogating a passive sensor comprising at least one resonator, making it possible to determine the natural frequency Fo of the resonator, the method comprising at least:
- a first phase of emission of an electromagnetic signal toward said passive sensor at an emission frequency Fe, the resonator oscillating in a forced regime at the emission frequency Fe and then oscillating at its natural frequency Fo when the emission is cut off;
- a first phase of reception of the damped signal oscillating at the natural frequency Fo, emitted by said passive sensor, in which a measurement of the frequency Fo is performed;
- a second phase of emission of an electromagnetic signal at the measured frequency Fo toward said passive sensor, the resonator oscillating in a forced regime at said measured frequency and then oscillating at its natural frequency when the emission is cut off;
- a second phase of reception of the damped signal oscillating at the natural frequency Fo, in which a measurement of the frequency Fo is performed, the determination of the natural frequency being stopped at least on the basis of the measurement performed in this second reception phase.

In the reception phase, the frequency received is for example transposed to an intermediate frequency Fi, the frequency measurement being performed on said intermediate frequency Fi, the measurement of the natural frequency Fo being deduced from the measurement of said intermediate frequency.

The intermediate frequency Fi can be slightly greater than 10 MHz.

The power level emitted in the first emission phase is for example greater than the power level emitted in the second emission phase.

In a particular mode of implementation, the measurement of the frequency of the signal received in the first reception phase is obtained by a ratiometric procedure simultaneously performing the counting of pulses at the frequency of the signal received and the counting of the pulses of a reference clock, the counting being performed between two coincidences of pulse edges.

The measurement of frequency of the signal received in the second reception phase is for example obtained by synchronous detection with phase coincidence.

The passive sensor is for example a sensor of the surface acoustic wave type.

Advantageously, the method can be applied to the measurement of a physical quantity, the natural frequency Fo being dependent on the physical quantity to be measured.

The subject of the invention is also a system for measuring the natural frequency of at least one passive sensor comprising at least one resonator, the system comprising at least one emission assembly, one reception assembly and one management unit, the management unit controlling the emission and the reception in such a way that:
- in a first emission phase, an electromagnetic signal is emitted by the emission assembly toward said passive sensor at an emission frequency Fe, said emission frequency being provided by a programmable frequency generator placed in the emission assembly and controlled by the management unit;

in reception, the damped signal received oscillating at the natural frequency Fo, emitted by said passive sensor, is guided toward means of measurement of the frequency Fo, said measurement being provided to the management unit;

the management unit controls said generator so that the latter provides a frequency equal to the measured frequency Fo";

in a second emission phase, an electromagnetic signal is emitted by the emission assembly at the measured frequency Fo toward said passive sensor;

in reception, the damped signal received oscillating at the natural frequency Fo, emitted by said passive sensor, is guided toward the means of measurement of the frequency Fo, said measurement being transmitted to the management unit, the measurement of the natural frequency being stopped at least on the basis of said measurement.

In a possible embodiment, the reception assembly comprises a programmable frequency generator controlled by the management unit and a microwave-frequency mixer, the signal received being guided toward a first input of said mixer and the output of said generator being guided toward the other input of said mixer, the output of said mixer delivering a signal at an intermediate frequency Fi, said signal being guided toward the measurement means, the frequency generator being controlled so as to provide a frequency equal to the difference of the intermediate frequency and of the frequency of the signal received (Fi-Fo).

The measurement means comprise for example shaping circuits transforming the received signal to be measured and a reference signal Fclk into pulsed signals, these signals each being directed to a counter which commences and then stops its counting on two successive edge coincidences, in parallel the signals each being directed to an edge detection circuit whose outputs are linked to a circuit for detecting coincidences, the output of the latter controlling the go/stop input of the counters, between two coincidences, the first counter counting a number A of frequency pulses of the signal received and the second counter counting a number B of reference frequency Fclk, the measurement of the frequency of the signal received being equal to (A/B)×Fclk.

The measurement is for example performed on the intermediate frequency Fi.

In another possible embodiment, the measurement means comprise a first counter and a second counter, the first counter counting the periods of the signal to be measured and the second counter counting the periods of a reference frequency, the duration of the two counts corresponding to an integer number N of periods of the signal to be measured, the number N being the result of the counting performed by the first counter, the measured frequency Fx being equal to $(N \cdot T/M \pm 1) \cdot Fr$ where M is the result of the counting performed by the second counter and Fr is the reference frequency.

The passive sensor being mobile, it comprises for example a plurality of antennas multiplexed with the emission and reception assembly, each antenna allowing the measurement of said natural frequency Fo at diverse points situated on the trajectory of said passive sensor.

The passive sensor is for example a sensor of the surface acoustic wave type.

The sensor allows notably the measurement of physical quantities, the natural frequency of the passive sensor being dependent on said physical quantities.

BRIEF DESCRIPTION OF THE DRAWINGS

Other characteristics and advantages of the invention will become apparent with the aid of the description which follows, given in relation to appended drawings which represent.

DETAILED DESCRIPTION

Figure 1:
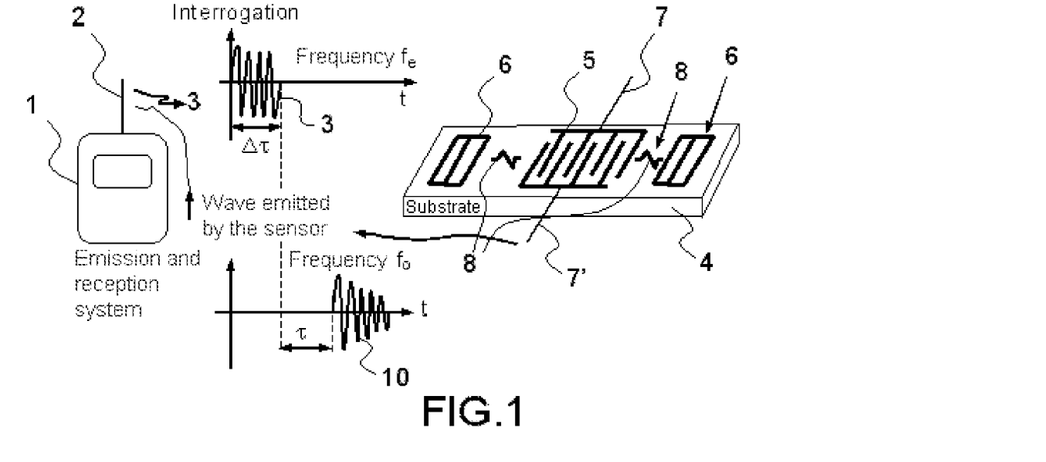
FIG. 1, an exemplary system for measuring a physical quantity remotely using a passive sensor.

FIG. 1 illustrates a system for remotely measuring a physical quantity using a surface acoustic wave (SAW) sensor implementing the method according to the invention. An emission and reception system 1, that will subsequently be referred to as a measurement system, equipped with an antenna 2 and with processing means, dispatches an electromagnetic wave 3 at an emission frequency Fe toward an SAW sensor 4.

The SAW sensor 4 comprises an interdigitated electrode comb transducer 5 placed between two reflector networks 6, the assembly being disposed on the surface of a piezoelectric substrate. Each comb is linked to an antenna element 7, 7', the assembly of these two elements forming the antenna of the sensor. When the antenna 7, 7' receives an electromagnetic signal 3, the latter gives rise to acoustic waves 8 on the surface of the substrate which are themselves reconverted into electrical energy on the antenna. It is thus possible to interrogate the sensor remotely, and therefore to perform remote measurements. For this purpose, the measurement system 1 dispatches a sufficiently powerful electromagnetic wave 3 during a given time interval, at a frequency Fe. The latter, picked up by the antenna 7, 7' coupled to the SAW sensor 4 causes the sensor to operate in a forced regime but, when this wave is cut off, the sensor continues to oscillate at its natural frequency Fo and emits, through its antenna 7, 7', an exponentially damped sinusoidal signal. This damped signal, forming an evanescent wave 10, of frequency Fo, is thereafter detected by the measurement system 1. The detection of the natural pseudo frequency Fo makes it possible to perform the measurement of the physical quantity sought, given that this natural frequency is a previously known function of the physical quantity to be measured, the temperature or the pressure for example.

The ratio of the emitted power, of the order of 2 W for example, to the power received can exceed $10^{10}$, i.e. 100 dB, and the useful duration of the signal is very small, often less than 10 µs notably in the case where the sensors exhibit a resonant frequency of greater than 100 MHz.

The reception at the level of the measurement system 1 is performed in a heterodyne manner, that is to say the frequency received is transposed to another frequency value, lower for example. In particular, starting from an emission frequency of the order of 869 MHz for example, the voltage at the level of the processing means is reduced to around a frequency Fi, termed the intermediate frequency, which is lower but sufficiently high, for example greater than 10 MHz, to afford a signal that is usable over several periods. Thus, if the useful duration τ of the signal received is 10 μs and the intermediate frequency Fi is 10 MHz, then 100 periods are available for analyzing the signal. The accuracy of the evaluation of the natural frequency Fo is all the more accurate the greater the duration of the wave train. For the intermediate frequency, it is possible to choose a standardized frequency, for example Fi=10.7 MHz.

Figure 2:
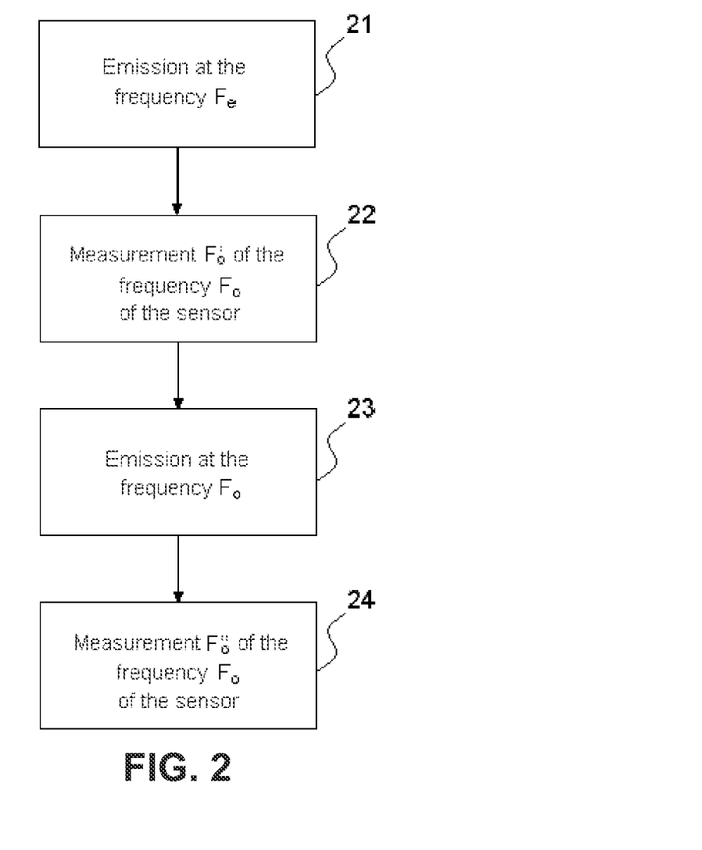
FIG. 2, various possible steps for the implementation of the method according to the invention.

FIG. 2 illustrates various steps of the method according to the invention for interrogating the passive sensor. The emission frequency Fe is slaved to the measurement of the resonant frequency Fo of the SAW sensor 4, contained in the return echo. In a first emission phase 21, the measurement system 1 emits a wave at a frequency Fe toward the SAW sensor 4. The emitted power can be of the order of a few watts. As indicated previously, the SAW sensor 4 oscillates in a forced regime at the frequency Fe and then oscillates at its natural frequency, or resonant frequency, Fo when the emission is cut off. This signal, of frequency Fo, is received at the level of the measurement system and then, for example, transposed into a proportional signal of frequency Fi=Fo-F1, F1 being previously defined so that Fi is reduced to slightly greater than 10 MHz for example.

In a first reception phase 22, the frequency Fo is therefore evaluated, more particularly a measurement of this natural frequency Fo is obtained, the value of this evaluation being denoted F'o.

The emission frequency is then slaved to this measurement, that is to say that in a second emission phase 23 the measurement system emits an electromagnetic wave at the measured frequency F'o. F'o is very close to Fo.

This slaving confers very high sensitivity on the measurement system. Indeed, during the second emission at the frequency F'o the SAW sensor 4 will oscillate in a forced regime at a frequency very close to its natural frequency. Consequently, the power level re-emitted via the return echo will be more significant, the amplitude of the signal originating from the SAW sensor 4 being a maximum when its oscillation is forced at its natural frequency. A gain of 20 dB, tripling the range with respect to an emission at Fe, can thus be readily obtained.

In particular, the fact of obtaining a return echo of more significant amplitude in the second reception phase 24 makes it possible to obtain the very accurate measurement right from the second emission whereas the conventional systems require a large number of emission phases before succeeding in determining a reliable measurement of the natural frequency Fo.

In a case of application where the duration of emission is equal to 10 μs, the second emission phase begins 100 μs later, an interval of 90 μs being necessary between the two emission series because of current normative constraints. Thus, a reliable measurement can be carried out in a duration of the order of 120 μs. This duration of measurement is markedly shorter than the customary measurements which can take several hundred milliseconds, thereby affording an improvement of at least a factor of 100.

The measurement conditions can moreover be improved. Indeed, the power emitted in the first phase 21 must be relatively significant. On the other hand, the power emitted in the second phase can be lower because of the relative power level of the echo received, markedly better than in the conventional solutions. Thus, it is possible to decrease the electromagnetic disturbances effectively, on the one hand by significantly decreasing the number of necessary emissions and on the other hand by using a low power for the second emission phase.

Moreover, the use of an intermediate frequency Fi of greater than 10 MHz also allows the implementation of techniques often used in radars, such as the compressor or limiter stages which transform over a dynamic swing that may possibly exceed 90 dB the evanescent wave produced by the SAW sensor 4 into a wave train. This transformation allows the accurate and ultrafast measurement of the frequency Fo, equally well with so-called digital procedures or with synchronous analog procedures. The latter procedures exhibit rejection of the noise received which further increases the range of the system, at equivalent power.

Figure 3:
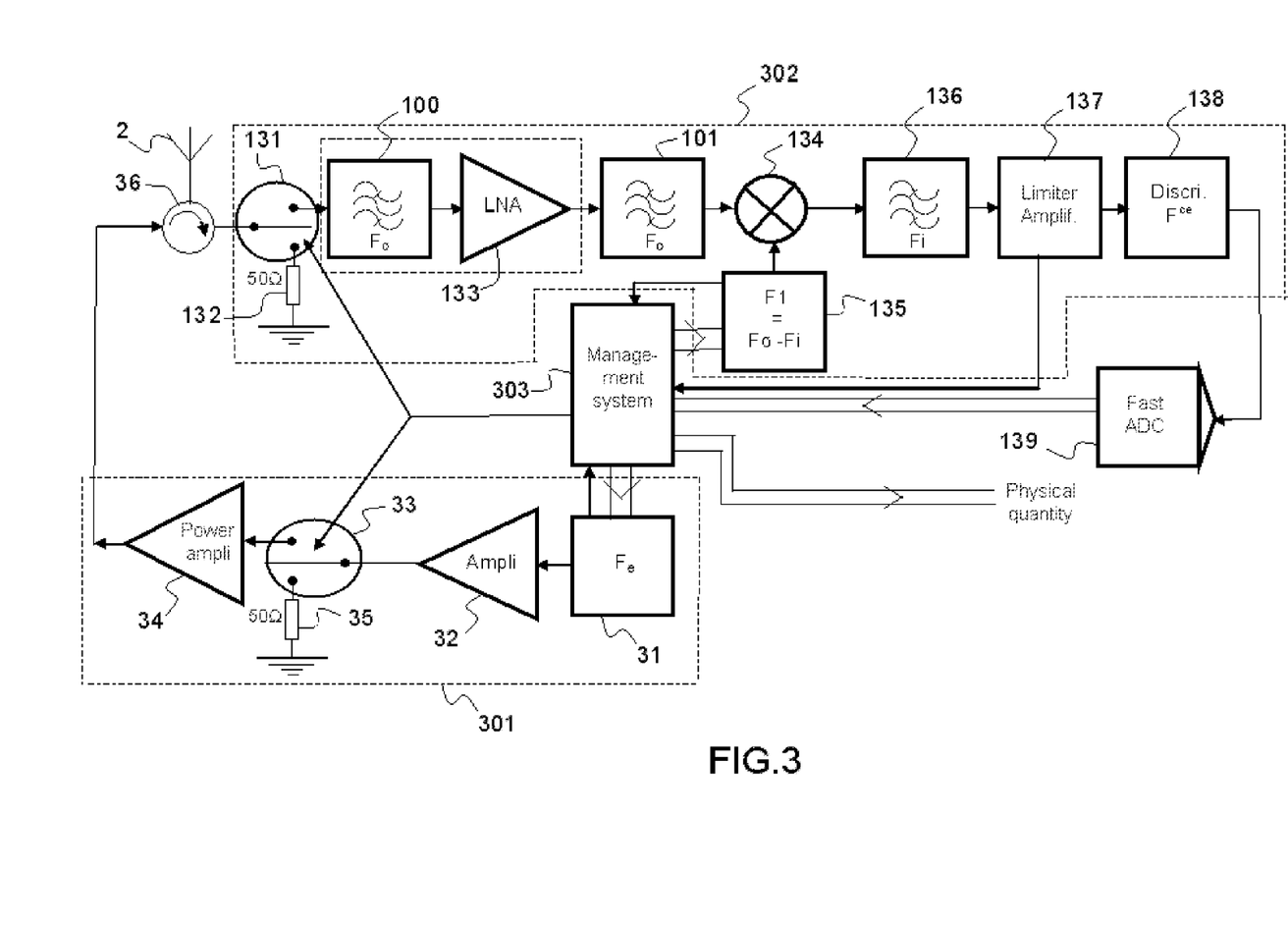
FIG. 3, an exemplary embodiment of a system for remotely measuring the natural frequency of a sensor.

FIG. 3 presents the main functional blocks of an exemplary embodiment of the measurement system 1, comprising notably emission means 301 and reception means 302 as well as processing means composed for example of a management unit 303, the antenna 2 being shared between the emission and reception means. The management unit 303 consists for example of a signal processor equipped with the necessary interfaces.

The emission assembly 301 comprises a programmable frequency generator 31. This generator delivers the emission frequency Fe used for the first emission phase. It is controlled by the management unit 303, the other functions of which will be described subsequently. The emission assembly 301 moreover comprises a first amplifier 32 amplifying the signal at the output of the generator 31. It comprises a first microwave-frequency switch 33 and a power amplifier 34. The switch 33 whose input is connected to the output of the first amplifier 32 steers the microwave-frequency signal either toward the power amplifier 34 or toward a load impedance 35 matched to the microwave-frequency line. The output of the power amplifier 34 is linked to the antenna 2 via a microwave-frequency circulator 36. The use of such a circulator 36 is optional insofar as the emission and reception pathways can be isolated on the one hand by the first switch 33 and on the other hand by a second switch 131 placed at the input of the reception assembly 302, the aim to be attained being to isolate the two pathways sufficiently. Indeed, a residual emission signal at the frequency Fe could enter the receiver 302 and disturb the detection of the signal output by the SAW sensor 4. The setup of FIG. 3 makes it possible to obtain an isolation of greater than 100 dB, which is therefore effective.

The reception assembly 302 therefore comprises at input a microwave-frequency switch 131 linking the output of the antenna 2, or the output of the circulator 36, either to the reception pathway, or to an adaptive load 132. The signal 100 received from the sensor at the frequency Fo is amplified by means of a low noise amplifier 133. The signal thus amplified 101 is transmitted to the input of a microwave-frequency mixer 134. The reception assembly 302 moreover comprises a frequency-programmable generator 135 providing a signal at a frequency F1. This signal is transmitted to the other input of the mixer 134 so as to perform a frequency transposition of heterodyne type. The output of the mixer then delivers a signal 136 at the intermediate frequency Fi=Fo-F1. The order of magnitude of the frequency Fo being known, it is possible to provide for the value of the frequency F1 as a function of this value Fo and of the order of magnitude of the intermediate frequency Fi desired, i.e. F1=Fo-Fi.

The signal 136 at intermediate frequency Fi is transmitted to means of extraction 137, 138, 139 of the frequency Fo whose value is transmitted to the management unit 303. These extraction means comprise for example a limiter amplifier 137, a frequency discrimination circuit 138 and a fast analog-digital converter 139. The discrimination circuit receives as input the signal from the limiter amplifier 137 and delivers as output a voltage representative of the intermediate frequency Fi. In order to be accurate and fast the measurement of the intermediate frequency Fi, more particularly the frequency discrimination, can be performed either by so-called phase coincidence synchronous detection, or with a fast and accurate digital measurement procedure. For this last procedure, it is possible to use the so-called ratiometric scheme, where the counting of the signal and the counting of the pulses of a reference clock are performed simultaneously, combined with detection of the coincidences of pulse edges so as to render this procedure still more accurate.

The voltage representative of the intermediate frequency Fi is converted digitally by the converter 139 and transmitted by the latter to the management unit 303 which deduces therefrom the measurement $F'_0$ of the frequency Fo through the knowledge of the frequency F1 at the input of the mixer 134. The management unit 303 can thereafter program the emission frequency generator 31 in such a way that the latter provides a signal whose frequency is equal to the measured frequency F'o. The signal emitted by the antenna 2 is then emitted with this frequency F'o. On completion of the reception corresponding to this second emission phase, the measurement $F''_0$ of frequency Fo gives the definitive measurement with the desired level of accuracy and reliability. Optionally, other iterations can be decided. In the example of FIG. 3, the measured physical quantity, dependent on the measured natural frequency Fo, is the temperature. The measured value of the latter is delivered on the output bus of the management unit 303. For this purpose, the management unit comprises for example in memory the correspondence between the values of the natural frequency Fo of the SAW sensor 4 as a function of its ambient temperature. The same operation could be performed with other physical quantities, the pressure for example.

The management unit 303 moreover controls the emission and reception phases. In particular it controls, by means of interfaces not represented, the microwave-frequency switches 33, 131; in the emission phase the first switch 33 linking the emission chain to the power amplifier 34, the second switch 131 being switched onto the adaptive load 132. In the reception phase, the positions of these switches are reversed.

The emission frequency generator 34 and the reception generator 135, both frequency-programmable, are for example sinusoidal generators with fast frequency jumps. They must indeed be able to carry out their frequency jumps very speedily, typically in less than 10 μs for SAW sensors 4 whose frequency Fo is below 1 GHz. The speed of these frequency jumps determines the minimum duration between two iterations, or two phases, of emission. This duration therefore determines the minimum time between two measurements. To obtain the necessary speed, it is possible to use generators employing direct synthesis of the signal.

The data regarding emission frequency Fe and transposition frequency F1 are programmed into the management unit 303. Depending on the case, the order of magnitude of the frequency Fo to be measured is or is not known. There may be examples of applications where the frequency Fo is totally unknown. Various strategies can therefore be envisaged. In this context, the initiation phase can be significant. It is necessary to be able to refine the strategy according to the data introduced. For example, if an order of magnitude of the result, that is to say of Fo, is known, then the initial frequency Fe can be specified accordingly, a more accurate value of Fo being produced in the second emission phase. In the converse case, a frequency where the maximum permitted power is largest can be chosen for the initial emission frequency Fe, in the allowed band, thereby compensating for the loss of sensitivity related to the ignorance of the order of magnitude of Fo.

Figure 4:
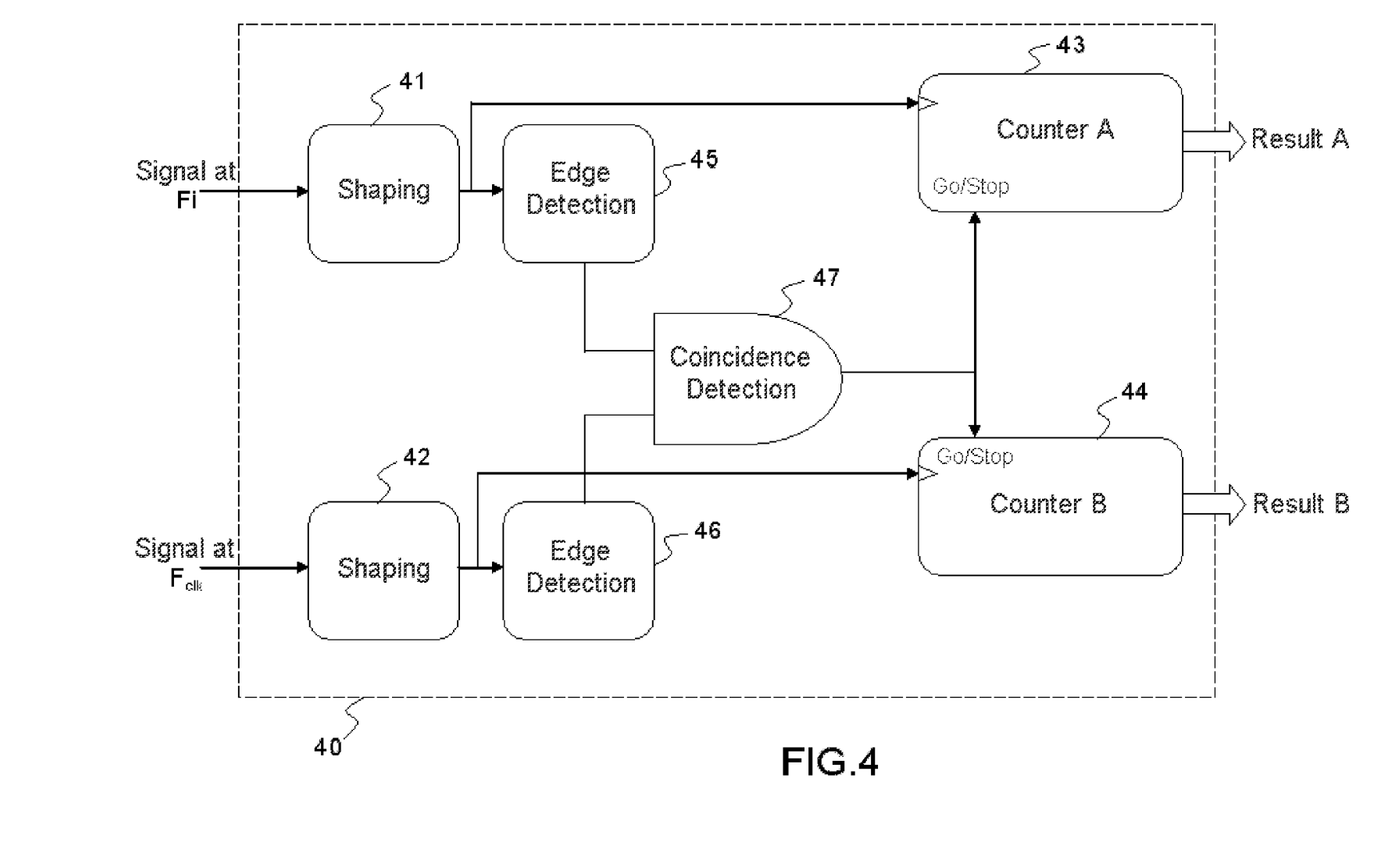
FIG. 4, an exemplary embodiment of a circuit for measuring the frequency of a received signal.

FIG. 4 illustrates an exemplary measurement of the frequency Fo. The measurement of this frequency Fo can depend on the known degree of accuracy of the previous measurement. During the first measurement, subsequent to the emission of the signal at the frequency Fe, it is possible to use the digital procedure, of the ratiometric type. FIG. 4 therefore presents a circuit 40 implementing this procedure. This circuit can easily be implanted in simple programmable logic systems.

By means of shaping circuits 41, 42, the microwave-frequency signal Fi to be measured and a reference signal Fclk are transformed into digital signals, Fi being the intermediate frequency produced on output from the mixer 134. The shaping circuits 41, 42 are based on comparators and deliver as output pulsed signals at the frequencies Fi and Fclk, a pulse being able to have a square shape. These signals are each directed to a counter 43, 44 which commences and then stops its count on two successive edge coincidences. In parallel, the signals are each directed to an edge detection circuit 45, 46 whose outputs are linked to a coincidence detection circuit 47, the output of the latter controlling the go/stop input of the counters 43, 44. Between two coincidences, the first counter 43 counts a number A of pulses of intermediate frequency Fi and the second counter counts a number B of pulses of frequency Fclk. The measurement of the intermediate frequency Fi is then given by the following relation:

$$Fi=(A/B)\times Fclk$$

The value Fclk being known and stored beforehand, the values A and B can then be provided directly to the management unit 303 which can deduce therefrom the value of the intermediate frequency Fi. This procedure is all the more accurate the lower the accepted tolerance in the coincidence detection. In the case of application of the invention where the limited duration of counting lowers the maximum value that can be attained by the result A, it is necessary to provide for a minimum tolerance. The solution illustrated by FIG. 4 makes it possible to obtain sufficient accuracy to determine, right from the first iteration, the frequency Fo with enough accuracy to program the frequency of emission of the second iteration close to Fo.

Right from the second iteration, it is thus possible to apply a more accurate procedure for measuring Fo. It is for example possible to use an analog procedure with synchronous detection.

Figure 5:
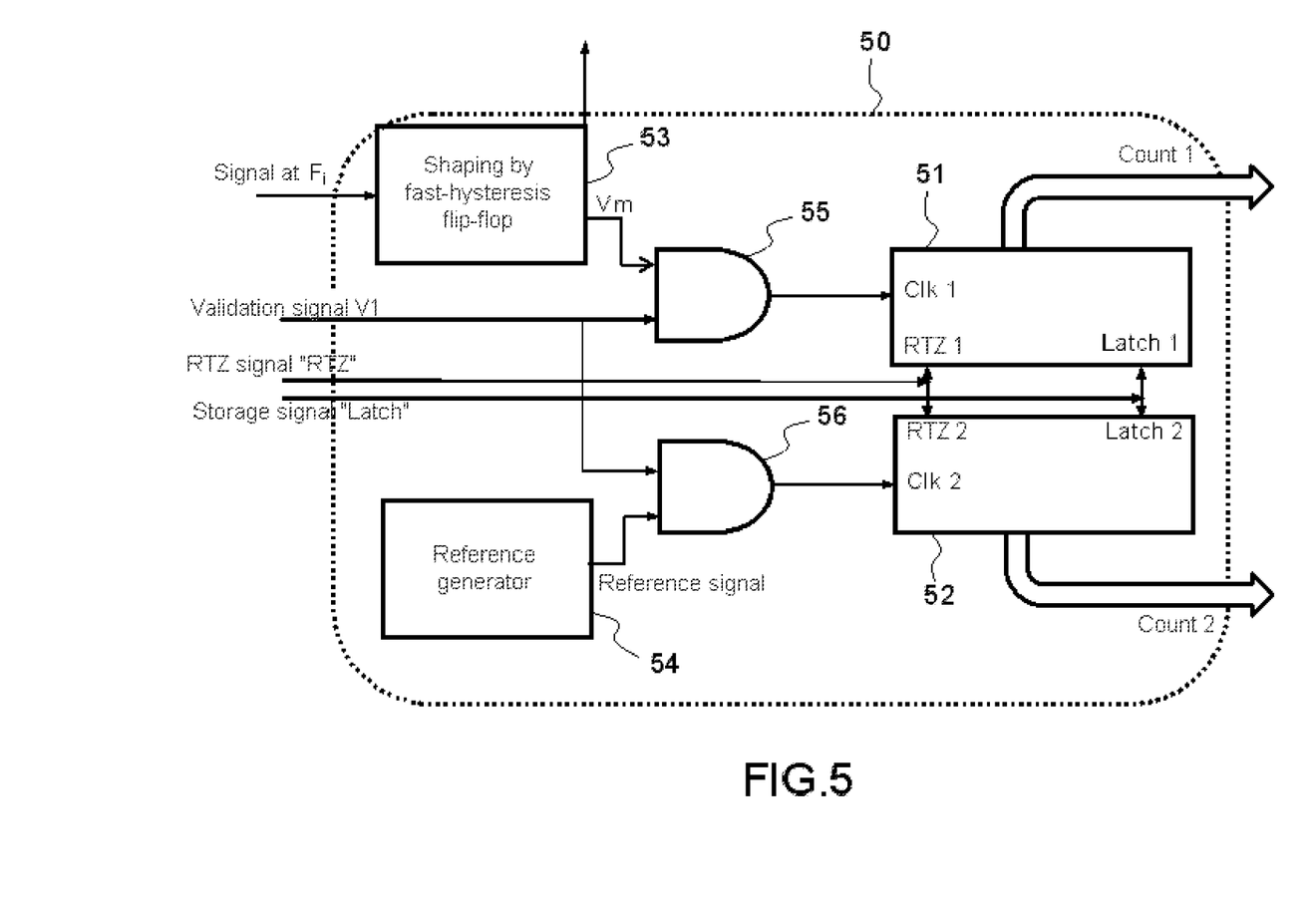
FIG. 5 illustrates another exemplary measurement of the frequency.

FIG. 5 illustrates another exemplary measurement of the frequency Fo. Its principle of implementation is based on the use of very fast counters 51, 52, one counting the periods of the signal to be measured, the other counting the periods of a reference frequency. The duration of the two counts corresponds to an integer number of periods of the signal to be measured. As in the case of FIG. 4, the signal to be measured is for example the signal at the frequency Fi on output from the mixer 134.

The counters have a reset-to-zero input RTZ1, RTZ2, a counting input Clk1, Clk2 and a storage input Latch 1, Latch 2. They are associated with logic components 53, 54, 55, 56 described hereinbelow, the assembly being able to be integrated into an FPGA 50 (Field-Programmable Gate Away).

The system of FIG. 5 uses five signals:

a validation signal V1;

the signal to be measured Fi, applied to the input Clk1 of the first counter 51 after shaping by a fast-hysteresis flip-flop 53, the shaped signal Vm being applied in combination with the validation signal V1;

a reference signal produced by a reference generator 54, having for example a frequency of 300 MHz accurate to within $10^{-7}$, applied to the input Clk2 of the second counter 52 in combination with the validation signal V1;

a reset-to-zero signal applied to the inputs RTZ1 and RTZ2 of the counters;

a signal for storing the counts, applied to the inputs Latch 1 and Latch 2 of the counters.

The reference signal and the signal Vm are for example combined with the validation signal V1 by means of "and" logic gates 55, 56.

The signal Vm can be delayed, for example by a few notches of 50 ns. Another solution consists in the counts being performed on the falling edges.

The duration of the validation signal V1 65 is a multiple of the pseudo-period of the signal received. For this purpose, an instant is firstly detected at which the measurement can be commenced and thereafter an instant is detected at which the measurement will have to stop rapidly and produce, on the basis of this information, a validation signal V1 synchronous with the signal received 3 transformed into signal compatible with the logic used.

Figure 6:
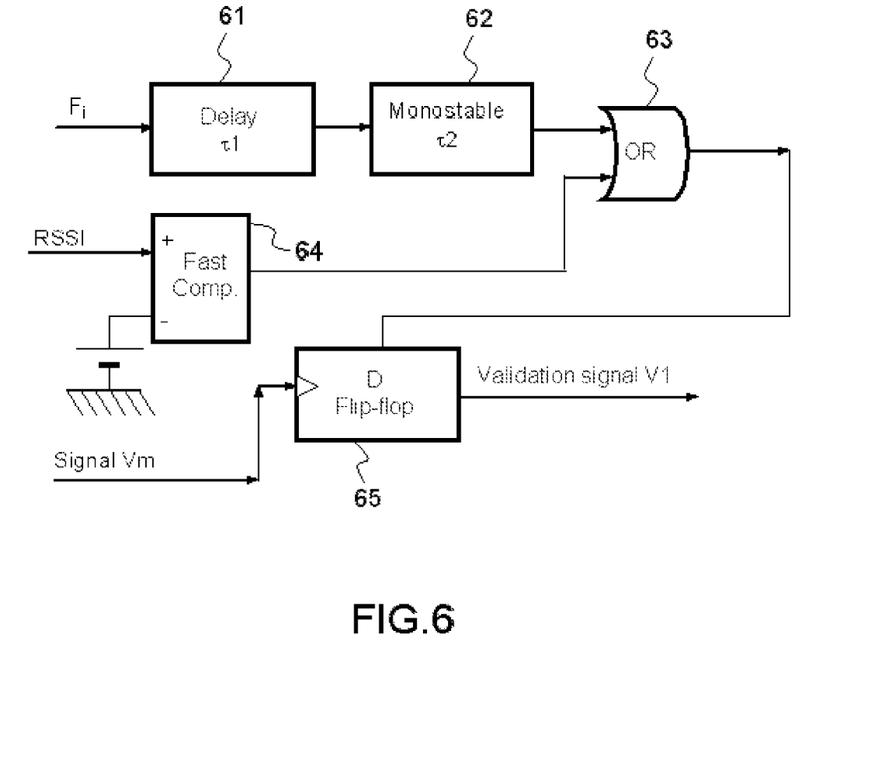
FIG. 6 illustrates a circuit for outputting a validation signal.

It would for example be possible to produce the start- and end-of-measurement signals (signal V1) on the basis of the known RSSI (Received Signal Strength Indication) signal. However, the circuits which rapidly carry out this function exhibit a reaction time which is still too long, thereby causing too significant a loss of the first clock ticks of the signal to be measured and therefore a decrease in the final accuracy of this measurement. In order to overcome this difficulty, provision is made to trigger the measurement with a fixed delay with respect to the end of the emission and to stop it by using the RSSI signal. On the basis of these two signals, the validation signal V1 is produced with a D flip-flop which receives the shaped signal Vm on its clock input Clk as shown by FIG. 6. Thus, in accordance with the preceding description, the signal Fi is taken into account by a delay circuit 61 followed by a monostable circuit 62, these two circuits 61, 62 constituting the aforementioned fixed delay. The output of the monostable circuit drives an input of an "or" gate 63. The other input of the "or" gate is linked to the output of a fast counter 64 reproducing the edges of the RSSI signal. The output of the "or" gate drives the D input of the flip-flop 65 whose clock input Clk is driven by the signal Vm, the output of the flip-flop 65 constituting the validation signal V1.

Thus, the validation signal V1 has an exact duration NT, which is a multiple of the period T of Vm, the period of the signal to be measured. N is the count produced by the first counter 51. If Tr is the period of the frequency generator 54, the count M of the counter 52 is then M=(N·T/Tr)±1. The frequency measured Fx, Fi in the present example, is given by the following relation:

$Fx=[N·/(M±1)]·Fr$ Fr being the reference frequency.

The relative accuracy is therefore 1/M, i.e. for a signal of 10.7 MHz, a reference frequency Fr=300 MHz and a wave train useful duration of the order of 5 µs an absolute accuracy which may attain 7 kHz (3.5 kHz for a signal duration of 10 µs).

As far as the obtaining of the signal Vm is concerned, the signal originating from the sensor 4 which has been excited by a wave train of frequency Fi of duration of about 10 µs (for 869 MHz sensors) is a signal output by the free oscillations at Fo of the sensor after its excitation under forced oscillations at Fi. This signal is damped oscillatory and, at the level of the receiver 302, even very sensitive, has a useful duration (guaranteeing a sufficient signal/noise ratio) of only 5 to 15 µs for the sensors used and in the chosen frequency band (for our trials, 869 MHz). A much higher useful duration is obtained at the lower frequencies (at 433 MHz for example) on account of the higher quality factor of the sensor and of a narrower passband of the receiver.

Advantageously, it is possible to use the European ISM band in the K sub-band (868 MHz to 870 MHz) and to process this signal by performing, in order, the following operations:

1) Emission/Reception switching by a fast switch (tc of the order of 40 ns) with high isolation (>80 dB) and then adaptation of the impedances to broadband but with negligible attenuation
2) Low noise amplification (better than 1 dB) with high resilience to strong signals (IP3 greater than 28 dBm) making it possible to have a usable output signal for an input power of greater than 0.17 pW (−98 dBm), antenna signal >3 $\mu Volts_{eff}$
3) "Energy-related" filtering of the band to be received (for example passband of 2 MHz for the European "869 MHz" band)
4) Frequency translation to an intermediate frequency $F_{MF}$ of greater than 10 MHz with a 3 dB passband ≥1 MHz
5) Limiter amplifier on the frequency $F_{MF}$ with high dynamic range (>100 dB) with output of an "RSSI" (Receiver Signal Strength Indication) signal with short response time (<75 ns)

This assembly makes it possible to obtain a rectangular envelope signal whose duration is dependent on the quality factor of the sensor and the resonant frequency of the sensor and whose frequency is the translated image of that of resonance of the sensor and thus makes it possible to ascertain the physical quantity to be measured:

with better accuracy than that obtained with the systems based on Fourier analysis (which require a time required for obtaining a result of greater than 100 ms)

with a time required for this measurement of less than 200 µs (to be compared with the previous time of more than 5000 times as long)

This measurement procedure moreover offers the novel possibility of carrying out accurate and fast tracking of the emission frequency on the natural frequency of the sensor, thereby making it possible on the one hand to increase the useful range of the measurement system and on the other hand to enhance the reliability of this measurement.

On initialization of the system the contents of the counters 51, 52 are set to zero, the counts commence with a delay dependent on the various delays in the processing chain and on the time to toggle, for the sensor, from the forced regime to the regime of free oscillations following the end of each wave train. Thereafter, the counts continue while the "RSSI" signal is of sufficient level. At the end of the counts the contents of the counters are placed in memory ("latch"), they constitute reflections of the counting time; if the latter are deemed insufficient the counters are reset to zero and the measurement is not taken into account and the cycle can start again. If the contents are sufficient, the measurement process is engaged and the quantity is measured, displayed and stored; the emission frequency is tailored to the measured resonance of the sensor; the counters are reinitialized and a new measurement can be performed.

A system implementing the method according to the invention can be used for applications requiring the measurement of a physical quantity at several points of an environment to be monitored. In this case, the various successive measurements can be carried out by means of a single sensor moving near successive antennas, these latter being multiplexed with the measurement system 1. Stated otherwise, the sensor being mobile, the measurement system 1 comprises a plurality of antennas multiplexed with the emission 301 and reception 302 assembly, each antenna allowing the measurement of the natural frequency Fo at diverse points situated on the trajectory of the sensor.

The method according to the invention can advantageously be used in numerous sectors both industrial and general-public. In particular, it can be used for measurements at high temperature, of the order for example of 1000° C., with ranges of a few meters. The applications envisaged can then be the measurements of temperature within high-temperature industrial furnaces in metallurgical and chemical plants for example.

Moreover, the very low sensitivity of SAW sensors to ionizing radiations, combined with the measurement performance of the invention, finds numerous applications requiring the remote measurement of accurate temperatures in the nuclear industry within the very general sense of the term, that is to say both for measurements in the core of a nuclear power station and for measurements in nuclear medical laboratories.

More generally, the invention allows accurate and remote measurements of physical quantities, including in severe environments, in terms of temperature or pressure for example, on mobile objects. It can thus be used for measurements of pressure inside tires fitted to automotive vehicles.

The invention can also be used for large-scale applications for the cheap, very fast, remote and accurate measurement of numerous quantities that are rather inaccessible to active or wired sensors. The physical quantities measured could thus be for example the amount of glucose in the blood of a living being, the sensor then being embedded in a capsule, the amount of chemical compounds (CO, $CO_2$, anesthetic gases, etc.) in the atmosphere or else the temperature at the center of a foodstuff placed in an oven.

The invention has been described in respect of the use of SAW sensors, it can of course be used for passive sensors comprising at least one resonator, the method making it possible to determine the natural frequency, or resonant frequency, of the resonator. This natural frequency, a known function of a physical quantity, then affords access to the measurement of this quantity.

The invention claimed is:

1. A method for remotely interrogating a passive sensor having at least one resonator to determine a natural frequency Fo of said resonator, the method comprising:
    a first phase of emission of an electromagnetic signal toward said passive sensor at an emission frequency Fe, the at least one resonator oscillating in a forced regime at the emission frequency Fe and then oscillating at the natural frequency Fo when the emission is cut off;
    a first phase of reception of a damped signal oscillating at the natural frequency Fo, emitted by said passive sensor, in which a measurement of the natural frequency Fo is performed to provide a measured frequency F'o;
    a second phase of emission of another electromagnetic signal at the measured frequency Fe F'o toward said passive sensor, the at least one resonator oscillating in a forced regime at said measured frequency F'o and then oscillating at the natural frequency Fo when the emission is cut off;
    a second phase of reception of the damped signal oscillating at the natural frequency Fo, in which another measurement of the natural frequency Fo is performed, the determination of the natural frequency being stopped at least on the basis of the measurement of the natural frequency performed in said second reception phase, said second phase of emission and said second phase of reception being repeatable.

2. The method as claimed in claim 1, wherein in the first or the second reception phases, received respective frequencies are transposed to an intermediate frequency Fi, a frequency measurement being performed on said intermediate frequency Fi, and the measurement of the natural frequency Fo being deduced from the measurement of said intermediate frequency Fi.

3. The method as claimed in claim 2, wherein the intermediate frequency Fi is greater than 10 MHz.

4. The method as claimed in claim 1, wherein a power level of the electromagnetic signal emitted in the first emission phase is greater than a power level of the another electromagnetic signal emitted in the second emission phase.

5. The method as claimed in claim 1, wherein the measurement of the natural frequency of the damped signal received in the first reception phase is obtained by a ratiometric procedure simultaneously performing a counting of pulses at the natural frequency Fo of the damped signal received and another counting of pulses of a reference clock, the another counting being performed between two coincidences of pulse edges.

6. The method as claimed in claim 1, wherein the measurement of the natural frequency Fo of the damped signal received in the second reception phase is obtained by a synchronous detection with a phase coincidence.

7. The method as claimed in claim 1, wherein the passive sensor is a surface acoustic wave type sensor.

8. The method as claimed in claim 1, wherein the method is applied to a measurement of a physical quantity, the natural frequency Fo being dependent on the physical quantity to be measured.

9. A system for measuring a natural frequency of at least one passive sensor having at least one resonator, said system comprising at least one emission assembly, one reception assembly and one management unit, said management unit controlling an emission and a reception in such a way that:
    in a first emission phase, an electromagnetic signal is emitted by the emission assembly toward said passive sensor at an emission frequency Fe, said emission frequency being provided by a programmable frequency generator placed in the emission assembly and controlled by the management unit;
    in a first reception phase, a damped signal is received oscillating at the natural frequency Fo, emitted by said passive sensor, is guided toward means of measurement of the natural frequency Fo to produce a measured frequency F'o, the measured frequency F'o being provided to the management unit;

the management unit is configured to control a generator that provides a frequency equal to the measured frequency F'o;

in a second emission phase, another electromagnetic signal is emitted by the emission assembly at the measured frequency F'o toward said passive sensor;

in a second reception phase, another damped signal is received oscillating at the natural frequency Fo, emitted by said passive sensor, is guided toward the means of measurement of the natural frequency Fo, said measured frequency F'o being transmitted to the management unit, the measurement of the natural frequency Fo being stopped at least when said measured frequency F'o is produced, said phases of second emission and second reception being repeatable.

10. The measurement system as claimed in claim 9, wherein the reception assembly comprises a programmable frequency generator controlled by the management unit and a microwave-frequency mixer, the damped signal received being guided toward a first input of said microwave-frequency mixer and an output of said programmable frequency generator being guided toward a second input of said microwave-frequency mixer, an output of said microwave-frequency mixer delivering a signal at an intermediate frequency Fi, said signal being guided toward the measurement means, said programmable frequency generator being controlled to provide a frequency equal to a difference (Fi-Fo) of the intermediate frequency Fi and of the natural frequency of the damped signal received.

11. The measurement system as claimed in claim 9, wherein the measurement means comprise shaping circuits transforming the damped signal to be measured and a reference signal Fclk into pulsed signals, said pulsed signals each being directed to counters which start and then stop counting on two successive edge coincidences, in parallel the pulsed signals each being directed to an edge detection circuit whose outputs are linked to a circuit for detecting coincidences, an output of the circuit for detecting coincidences controlling a go/stop input of the counters, between two successive edge coincidences, a first counter among the counters counting a number A of frequency pulses of the damped signal received and a second counter among the counters counting a number B of a reference frequency Fclk, the measurement of the frequency of the damped signal received being equal to $(A/B) \times Fclk$.

12. The measurement system as claimed in claim 9, wherein the measurement means comprise a first counter and a second counter, the first counter counting periods of the damped signal to be measured and the second counter counting the periods of a reference frequency, a duration of respective counts of the first counter and the second counter corresponding to an integer number N of periods of the damped signal to be measured, the number N being a result of the counting performed by the first counter, the measured frequency Fx being equal to $(N \cdot T/M \pm 1) \cdot Fr$ where M is a result of the counting performed by the second counter and Fr is the reference frequency.

13. The measurement system as claimed in claim 10, wherein the measurement is performed at the intermediate frequency Fi.

14. The measurement system as claimed in claim 9, wherein said passive sensor is mobile and comprises a plurality of antennas multiplexed with the emission assembly and the reception assembly, each antenna in the plurality of antennas allowing the measurement of said natural frequency Fo at diverse points situated on a trajectory of said passive sensor.

15. The measurement system as claimed in claim 9, wherein said passive sensor is a surface acoustic wave type sensor.

16. The measurement system as claimed in claim 9, wherein the measurement system is configured for measurement of physical quantities, the natural frequency of the passive sensor being dependent on said physical quantities.

* * * * *

UNITED STATES PATENT AND TRADEMARK OFFICE
CERTIFICATE OF CORRECTION

PATENT NO. : 9,784,775 B2  
APPLICATION NO. : 14/353275  
DATED : October 10, 2017  
INVENTOR(S) : Mohamed M'Jahed et al.

Page 1 of 1

It is certified that error appears in the above-identified patent and that said Letters Patent is hereby corrected as shown below:

In the Claims

Line 7, Column 12 Claim 1, "frequency Fe F'o toward" should read --frequency F'o toward--.

Signed and Sealed this
Fourteenth Day of November, 2017

Joseph Matal
*Performing the Functions and Duties of the
Under Secretary of Commerce for Intellectual Property and
Director of the United States Patent and Trademark Office*